United States Patent
Kautzsch et al.

(10) Patent No.: US 10,347,778 B2
(45) Date of Patent: *Jul. 9, 2019

(54) GRADED-INDEX STRUCTURE FOR OPTICAL SYSTEMS

(71) Applicant: Infineon Technologies AG, Neubiberg (DE)

(72) Inventors: Thoralf Kautzsch, Dresden (DE); Heiko Froehlich, Radebeul (DE); Maik Stegemann, Pesterwitz (DE); Mirko Vogt, Dresden (DE)

(73) Assignee: Infineon Technologies AG (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/105,193

(22) Filed: Aug. 20, 2018

(65) Prior Publication Data

US 2018/0358483 A1    Dec. 13, 2018

Related U.S. Application Data

(63) Continuation of application No. 15/345,015, filed on Nov. 7, 2016, now Pat. No. 10,084,101.

(51) Int. Cl.
*H01L 31/02*  (2006.01)
*H01L 31/0232*  (2014.01)
(Continued)

(52) U.S. Cl.
CPC ...... *H01L 31/02327* (2013.01); *H01L 27/146* (2013.01); *H01L 27/14618* (2013.01);
(Continued)

(58) Field of Classification Search
CPC ......... H01L 31/02327; H01L 31/02016; H01L 31/0203
See application file for complete search history.

(56) References Cited

U.S. PATENT DOCUMENTS 6,490,393 B1 * 12/2002 Zhou ................. G02B 6/12002
359/571
7,068,432 B2 * 6/2006 Boettiger ............. G02B 3/0018
216/26
(Continued)

FOREIGN PATENT DOCUMENTS

WO    2006131889 A2    12/2006
WO    2009030980 A2    12/2009

OTHER PUBLICATIONS

Levy, Uriel, Maziar Nezhad, Hyo-Chang Kim, Chia-Ho Tsai, Lin Pang, Yeshaiahu Fainman, "Implementation of a Graded-Index Medium by Use of Subwavelength Structures With Graded Fill Factor", J. Opt. Soc. Am A, vol. 22, No. 4, Apr. 2005, pp. 724-733.

*Primary Examiner* — Fernando L Toledo
*Assistant Examiner* — Neil R Prasad
(74) *Attorney, Agent, or Firm* — Design IP

(57) ABSTRACT

An optical system and photo sensor pixel are provided. The photo sensor pixel includes a substrate including an active region and a peripheral region that is peripheral to the active region, an optical sensor disposed at the active region of the substrate and configured to receive light and output a measurement signal based on the received light, and an encapsulation layer disposed over the active region and the first peripheral region of the substrate. The encapsulation layer includes at least one subwavelength-based graded index structure provided over the peripheral region of the substrate, and the subwavelength-based graded index structure is configured to redirect the light from a region over the peripheral region onto the optical sensor.

20 Claims, 4 Drawing Sheets

(51) Int. Cl.
*H01L 31/0203* (2014.01)
*H01L 27/146* (2006.01)
(52) U.S. Cl.
CPC .... *H01L 27/14629* (2013.01); *H01L 31/0203* (2013.01); *H01L 31/02016* (2013.01)

(56) References Cited

U.S. PATENT DOCUMENTS

| | | | |
|---|---|---|---|
| 7,196,388 B2* | 3/2007 | Wu | H01L 27/14627 257/431 |
| 7,729,055 B2* | 6/2010 | Liu | G02B 3/0062 359/619 |
| 2004/0081399 A1* | 4/2004 | Zheng | G02B 6/124 385/37 |
| 2014/0209928 A1* | 7/2014 | Teng | H01L 25/0753 257/82 |
| 2015/0234221 A1* | 8/2015 | Anderson | G02F 1/13363 349/113 |
| 2016/0161331 A1* | 6/2016 | Liu | H01L 31/18 250/552 |

* cited by examiner

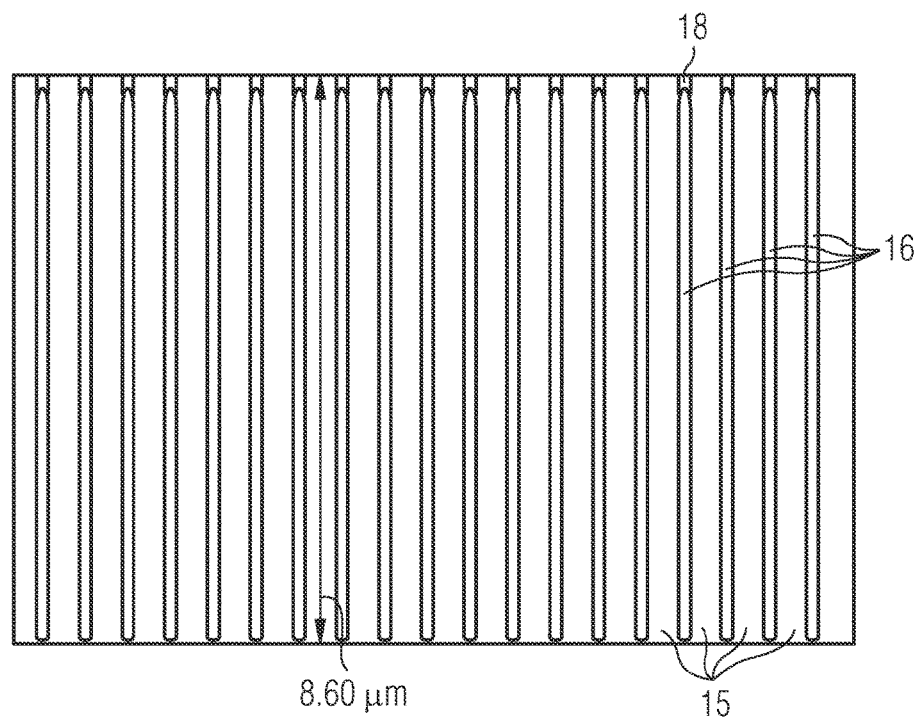

GRADED-INDEX STRUCTURE FOR OPTICAL SYSTEMS

CROSS REFERENCE TO RELATED APPLICATION(S)

This application is a continuation of U.S. patent application Ser. No. 15/345,015 filed on Nov. 7, 2016, which is incorporated by reference as if fully set forth.

FIELD

The present disclosure relates generally to a device and to methods related to integrated optical systems, and, more particularly, to integrated optical systems configured with a graded-index structure.

BACKGROUND

Integrated optical systems combine a light receiving structure with circuitry for evaluation of the received signal on a single chip. This allows minimum feature sizes and compact, multifunctional designs. With progressing miniaturization, there is a challenge to uphold high fill factors (i.e., the ration between active area and overall area of a photo-sensitive pixel), since wiring and peripheral circuitry limits the area that is left for photo detection. Furthermore, a portion of the light is reflected or absorbed in the region of peripheral circuitry. This share of the photosensitive pixel is unused and the overall sensitivity of the device is reduced.

Currently, a one way to provide a higher fill factor is the implementation of curved micro lenses. Incoming light is focused by a curved micro lens to the active area of a photo sensor pixel. However, this setup is elaborate in fabrication and the curved shape of the micro lens limits the combination with other elements. The use of the curved micro lens is especially limited when there is a need of spectral filters, as the deposition of the latter is difficult due to the rounded surfaces of the lenses.

Therefore, an improved device having a higher fill factor and an increased sensitivity without the use of a curved structure may be desirable.

SUMMARY

An optical system and photo sensor pixel are provided. The photo sensor pixel includes a substrate including an active region and a peripheral region that is peripheral to the active region, an optical sensor disposed at the active region of the substrate and configured to receive light and output a measurement signal based on the received light, and an encapsulation layer disposed over the active region and the first peripheral region of the substrate. The encapsulation layer includes at least one subwavelength-based graded index structure provided over the peripheral region of the substrate, and the subwavelength-based graded index structure is configured to redirect the light from a region over the peripheral region onto the optical sensor.

Embodiments further provide an optical system that includes a substrate including an active region and a peripheral region that is peripheral to the active region, an optical sensor disposed at the active region of the substrate and configured to receive light and output a measurement signal based on the received light, and an encapsulation layer disposed over the active region and the first peripheral region of the substrate. The encapsulation layer includes at least one subwavelength-based graded index structure provided over the peripheral region of the substrate, and the subwavelength-based graded index structure is configured to redirect the light from a region over the peripheral region onto the optical sensor.

Embodiments further provide an optical system that includes a substrate including an active region and a peripheral region that is peripheral to the active region, an optical sensor disposed at the active region of the substrate and configured to receive light and output a measurement signal based on the received light, and at least one subwavelength-based graded index structure provided over the peripheral region of the substrate, wherein the subwavelength-based graded index structure is configured to redirect the light from a region over the peripheral region onto the optical sensor.

BRIEF DESCRIPTION OF THE DRAWINGS

Embodiments are described herein making reference to the appended drawings.

FIG. 4 illustrates a cross-sectional view of a graded-index structure according to one or more embodiments.

DETAILED DESCRIPTION

Figure 1:
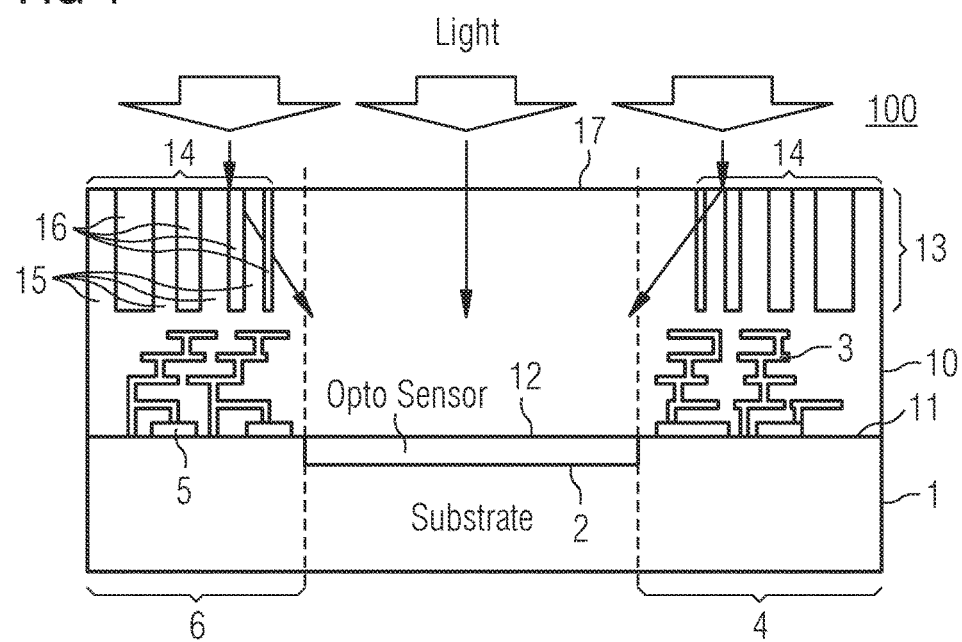
FIG. 1 illustrates a cross-sectional view of a photo sensor pixel of an optical system according to one or more embodiments.

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

Embodiments relate to optical sensors and optical sensor systems and to obtaining information about optical sensors and optical sensor systems. A sensor may refer to a component which converts a physical quantity to be measured to an electric signal, for example a current signal or a voltage signal. The physical quantity may, for example, comprise electromagnetic radiation, such as visible light, infrared (IR) radiation, or other type of illumination signal, a current, or a voltage, but is not limited thereto. For example, an image sensor may be a silicon chip inside a camera that converts photos of light coming from a lens into voltages. The larger the active area of the sensor, the more light that can be collected to create an image.

A sensor device as used herein may refer to a device which comprises a sensor and further components, for example biasing circuitry, an analog-to-digital converter or a filter. A sensor device may be integrated on a single chip, although in other embodiments a plurality of chips or also components external to a chip may be used for implementing a sensor device.

According to one or more embodiments, an integrated optical system may be, for example, an optical sensor or a photo sensor, and, more particularly, an active-pixel sensor (APS). An APS is an image sensor consisting of an integrated circuit containing an array of pixel sensors (i.e., a pixel array), each pixel containing a photodetector and an active amplifier. The pixel array may be integrated together with mixed signal circuitry of the sensor into a single chip by, for example, a complementary metal-oxide-semiconductor (CMOS) process. CMOS sensors may include transistors associated with each pixel, and each pixel may be read individually. Thus, the APS may be a CMOS APS, but is not limited thereto and may be any type of APS.

As used herein, the term "active pixel sensor" may is also used to refer to the individual pixel sensor itself, as opposed to the image sensor. In that case the image sensor may be referred to as an "active pixel sensor imager" or "active-pixel image sensor". Further, as used herein, an individual pixel may be referred to as an "image sensor pixel", "photo sensor pixel", or a "photosensitive pixel".

The image sensor may be a three-dimensional image (3DI) sensor, and, more particularly, may be a 3D depth camera that configured to emit modulated IR light and measure the time the IR signal takes to travel from the depth camera 1 to an object and back again. The elapsed time, referred to as a "time-of-flight," enables the 3D depth camera to generate image raw data on a pixel-by-pixel basis and output the image raw data to a processor. The processor may include one or more processors, such as one or more central processing units (CPUs), digital signal processors (DSPs), general purpose microprocessors, application specific integrated circuits (ASICs), field programmable logic arrays (FPGAs), or other equivalent integrated or discrete logic circuitry.

FIG. 1 illustrates a cross-sectional view of a photo sensor pixel 100 of an optical system according to one or more embodiments. The photo sensor pixel 100 includes a substrate 1, an optical sensor 2 (i.e., an optically active region), a peripheral circuit 3 and an encapsulation layer 10. The encapsulation layer 10 further includes a focusing layer 13 that includes a graded-index structure 14. The graded-index structure 14 is configured to focus and/or redirect light onto the optical sensor 2 of the photo sensor pixel 100. The graded-index structure 14 may be formed at or near an upper surface 17 of the encapsulation layer 10. An upper surface of the focusing layer 13 may coincide with the upper surface 17 of the encapsulation layer 10. Furthermore, the encapsulation layer 10 and the focusing layer 13 may be formed as a single, integral structure. In other embodiments, the encapsulation layer 10 and the focusing layer 13 may be formed as separate layers from different or same materials.

The substrate 1 may be a semiconductor substrate to which the optical sensor 2 and the peripheral circuit 3 are formed thereon and/or therein.

The optical sensor 2 is an active pixel region of the photo sensor pixel 100 integrated on the substrate 1. The optical sensor 2 is configured to receive light and output a measurement signal (e.g., a voltage signal) to the peripheral circuit 3 based on the received light.

The peripheral circuit 3 is integrated on the substrate 1 and may include one or more circuitry components described above. The peripheral circuit 3 is provided on the substrate 1 outside of, but in proximity to, the active region of the photo sensor pixel 100. In particular, the peripheral circuit 3 is provided at a periphery of the optical sensor 2. One of more peripheral circuits 3 may be provided at a peripheral region 4 that is adjacent to one side of the optical sensor 2, at two or more peripheral regions that are adjacent to multiple sides of the optical sensor 2, or may be provided at a peripheral region or regions that completely surround the optical sensor 2 around its periphery. Thus, one or more additional peripheral circuits 3 may be provided at one or more additional peripheral sides (or regions) of the optical sensor 2. For example, a peripheral circuit 5 may be provided at a second peripheral side 6 of the optical sensor 2.

The encapsulation layer 10 may be a high-index slab waveguide that is provided on a surface 11 the substrate 1 and on a surface 12 of the optical sensor 2 such that an exposed portion of the optical sensor 2 is encased by the encapsulation layer 10. The peripheral circuits 3 and 5 may further be encased by the focusing layer 10. The encapsulation layer 10 may be made of a high-index material, such as silicon, silicon oxide, nitride, dielectric, composite, or the like, and is not limited thereto.

The focusing layer 13 includes one or more graded-index structures 14 configured to focus and redirect light onto the optical sensor 2. In particular, a graded-index structure 14 may be formed by etching one-dimensional subwavelength gratings 15 into the focusing layer 13 (or encapsulation layer 10) to achieve a desired effective index distribution (i.e., to modulate an effective index of refraction). The effective index of refraction represents an overall delay of a light beam as it travels through the graded-index structure 14. Thus, the effective index of refraction corresponds to a degree of refraction the light beam experiences as it travels through the graded-index structure 14.

The focusing layer 13 may be made of a high-index material, such as silicon, silicon oxide, nitride, dielectric, composite, or the like, and is not limited thereto. The grating structures 15 may comprise a same material as that of the encapsulation layer 10, especially in the case when the encapsulation layer 10 and the focusing layer 13 form a single, integral structure.

Each graded-index structure 14 may be formed in one or more peripheral regions (e.g., peripheral regions 4 and 6). As described above, each peripheral region may include a peripheral circuit (e.g., peripheral circuit 3 and 5) such that a graded-index structure 14 is disposed above a peripheral circuit. However, it will be appreciated that this is not required, and a graded-index structure 14 may be formed in a peripheral region that does not contain a peripheral circuit.

As used herein, "subwavelength" may refer to nanostructures where the feature size is of the order of hundreds of nanometers or below such that the structures are much smaller than the optical wavelength in the material.

According to one or more embodiments, the graded-index structure 14 is an optical structure that may use two materials (e.g., silicon and air) with a changing proportion over position. In this way, lenses, beam splitters and birefringent structures may be formed. For example, a graded-index profile can be achieved by gradually modifying a duty ratio of the gratings 15 along a horizontal axis. Gaps 16 may be formed as slots between the gratings 15 and may remain as openings such that air serves as a filler material in the gaps 16 between gratings 15. Alternatively, the gaps 16 may be sealed such that air or a vacuum is provided as the material within the gaps 16, or the gaps 16 may be filled, at least partially, with another low-index material, such as oxide. In other embodiments, the gaps 16 may be filled with two or more materials. The gaps 16 may be formed as trenches, and may be referred to as such, by etching into the focusing layer 12. Once the trenches 16 are formed, the gratings 15 are formed in kind.

By altering the graded index pattern in which the gaps 16 are formed to create the gratings 15, the gratings 15 may have subwavelength periodic or aperiodic geometries. Furthermore, a width of each grating 15 and each gap 16 may be constant or variable. Thus, the gratings 15 may or may not have a fixed periodicity in the horizontal x-direction, and may have a duty ratio varied to control a local effective refractive index to control the angle of refraction of light impinging on the graded-index structure 14. Thus, the angle of refraction of light can be controlled such that light impinging at an inner region of the graded-index structure 14 is redirected differently than light impinging at a middle or outer region of the graded-index structure 14. In this way, the graded-index structure 14 is configured such that light is redirected towards the optical sensor 2 regardless of a point of impingement on the graded-index structure 14.

As long as graded index patterns use a period of the graded-index structure 14 that is smaller than the ratio of wavelength and refraction index of the highly refractive material (i.e., of the material of gratings 15), the effective refraction index is approximated by a second-order effective-medium theory. For a two dimensional structure, the effective refraction indices $n_{TE,2}$ and $n_{TM,2}$ for transverse electric (TE) and transverse magnetic (TM) polarizations, respectively, are given by the following equations:

$$n_{TE,2}^2 = n_{TE,0}^2 + \frac{1}{3}\left[\frac{\Lambda}{\lambda}\pi f(1-f)(n_1^2 - n_2^2)\right]^2$$

$$n_{TM,2}^2 = n_{TM,0}^2 + \frac{1}{3}\left[\frac{\Lambda}{\lambda}\pi f(1-f)\left(\frac{1}{n_1^2} - \frac{1}{n_2^2}\right)n_{TE,0} \cdot n_{TM,0}^3\right]^2$$

$$n_{TE,0}^2 = fn_1^2 + (1-f)n_2^2$$

$$n_{TM,0}^2 = \frac{(n_1 n_2)^2}{fn_2^2 + (1-f)n_1^2}$$

Here, $\Lambda$ is the period of the graded-index structure 14, $\lambda$ is the optical wave length in a vacuum, f is the duty ratio of the graded index pattern, and $n_1$ and $n_2$ are the refractive indices of the two materials (i.e., of the material of the gratings 15 and gaps 16, respectively).

Figure 2:
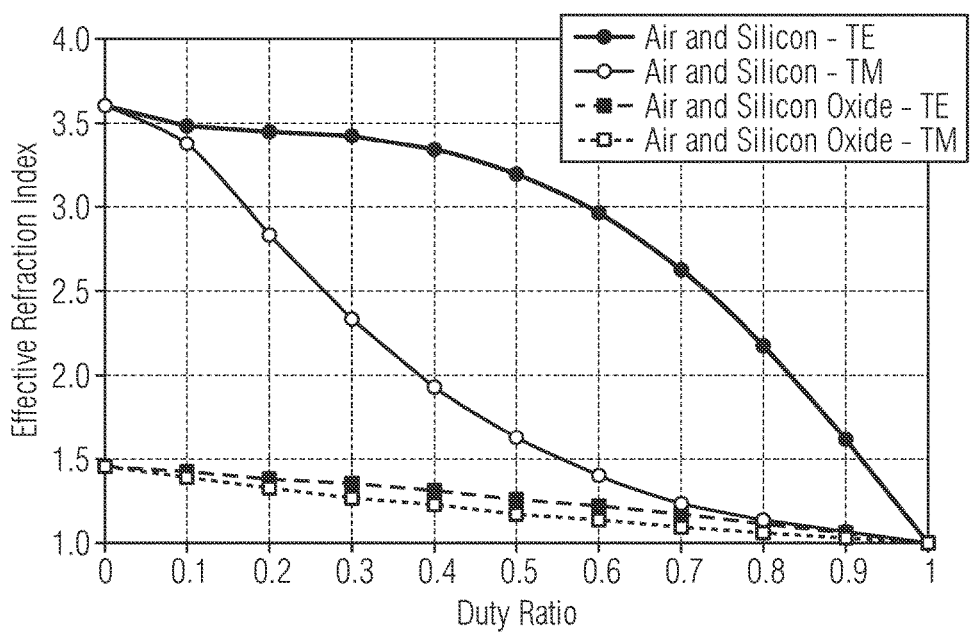
FIG. 2 illustrates an effective refraction index for two pairs of materials for respective TE and TM polarizations.

Birefringence is not beneficial for guiding light independently from its polarization. In the case the graded-index structure 14 is birefringent, the effect of birefringence is strongly dependent from the ratio of the two indices of refraction $n_1$ and $n_2$. FIG. 2 illustrates an effective refraction index for two pairs of materials for respective TE and TM polarizations. Specially, the two pairs of materials are air and silicon and air and silicon oxide, where air in each example corresponds to $n_2$ and the other material corresponds to $n_1$. Although the pair silicon/air would allow the fabrication of thinner lenses, it shows a pronounced effect of birefringence. Thus, using silicon oxide instead of silicon or another material with a high index of refraction is beneficial for guiding light into optically active areas (i.e., optical sensor 2). The ratio of effective refraction indices for TE and TM polarization differ only slightly (e.g., within 30% of each other), which may enable more simple designs.

The sub-wavelength graded index patterns of the graded-index structure 14 may be fabricated as long trench and/or mesa structures as well as circular trenches. The latter are mechanically stable, even at ultra-high aspect ratios and a high fraction of air or vacuum. Therefore, a hexagonal pattern of circles with its density of up to πc/sqrt(12) is well suited to establish graded index elements and allows very small periods of the graded-index structure 14.

Figure 3A:
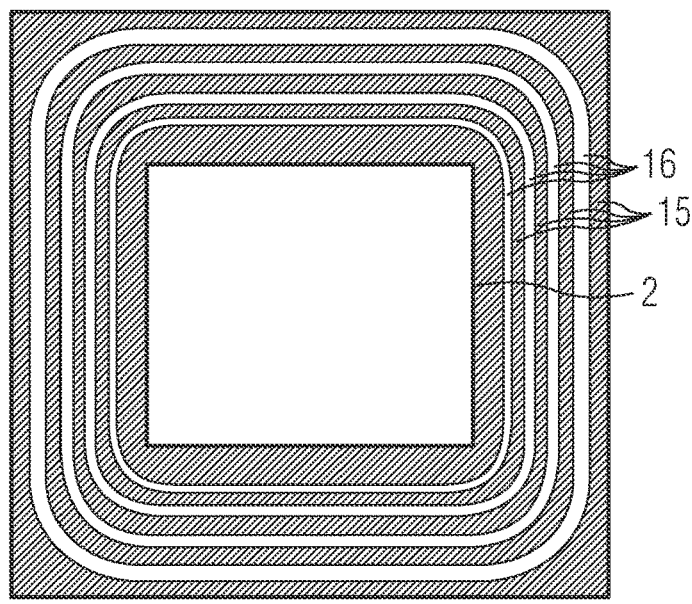
FIGS. 3A and 3B illustrate top views of implementations for graded index designs according to one or more embodiments.
Figure 3B:
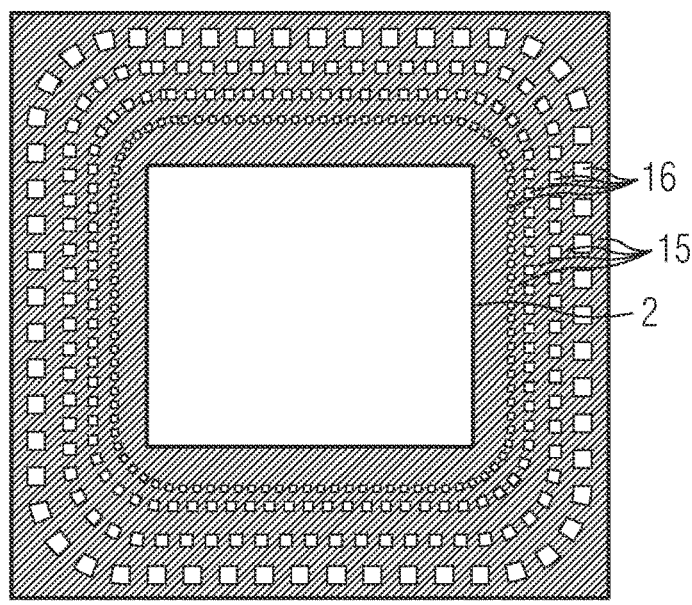

FIGS. 3A and 3B illustrate top views of implementations for graded index designs according to one or more embodiments. In particular, FIG. 5A shows a graded index pattern of a graded-index structure 14 using (continuous) lines of circular trenches 16 of various thicknesses that surround a periphery of the optical sensor 2. Here, the trenches 16 are increase in thickness from an inner periphery region to an outer periphery region. Similarly, FIG. 3B shows a graded index pattern of a graded-index structure 14 using (discontinuous) lines of rectangular trenches 16 of various sizes that surround a periphery of the optical sensor 2. Here, the trenches 16 are increase in thickens or size from an inner periphery region to an outer periphery region.

As long as the light is re-directed to a confined region of a pixel (e.g., the optical sensor 2) by the graded-index structure 14, the requirements in terms of imaging quality are relaxed. In this case, birefringence is of second order importance and even long trench patterns are applicable.

FIG. 4 illustrates a cross-sectional view of a graded-index structure 14 according to one or more embodiments. In particular, the fabrication of the graded-index structure 14 makes use of an ultra-high aspect ratio trench pattern that is etched into an oxide or another material to form grating 15 in a first processing step. In a second processing step, the openings of trenches 16 are sealed with an oxide plug 18. This may be done using high density plasma (HDP) oxide. Each oxide plug 18 may be separate from each other or formed as a plug layer that seals multiple trench openings.

In view of the above, the use of sub-wavelength patterns as a graded index structure 14 on optical sensor chips may provide a high fill factor while allowing focusing structures to be combined easily with spectral filters or other optical elements. Furthermore, in one or more embodiments, the graded-index structure 14 may be partly or completely embedded into a backend of line metallization stack used in backend of line processing such that the graded-index structure 14 is formed during the backend process. In this example, the trenches 16 are etched to have a depth of about 8.6 μm.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Depending on certain implementation requirements, embodiments provided herein can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The above described exemplary embodiments are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. An optical system, comprising:
a substrate including an active region and a peripheral region that is peripheral to the active region;
an optical sensor disposed at the active region of the substrate and configured to receive light and output a measurement signal based on the received light; and
at least one subwavelength-based graded index structure provided over the peripheral region of the substrate, wherein the subwavelength-based graded index structure is configured to redirect the light from a region over the peripheral region onto the optical sensor,
wherein the subwavelength-based graded index structure comprises a graded index pattern having a varied duty ratio such that a local effective refractive index of the subwavelength-based graded index structure varies according to the varied duty ratio.

2. The optical system of claim 1, wherein:
light impinging at an inner region of the subwavelength-based graded index structure is redirected at a first angle towards the optical sensor and light impinging at an outer region of the subwavelength-based graded index structure is redirected at a second angle, different from the first angle, towards the optical sensor such that the optical sensor receives the light from the inner region and the light from the outer region of the subwavelength-based graded index structure.

3. The optical system of claim 1, wherein the subwavelength-based graded index structure is excluded from a region over the active region.

4. The optical system of claim 1, wherein the optical system is a photo sensor pixel.

5. The optical system of claim 1, further comprising:
an encapsulation layer disposed over the active region and the peripheral region of the substrate, wherein the encapsulation layer includes the at least one subwavelength-based graded index structure.

6. The optical system of claim 1, further comprising:
a peripheral circuit disposed on the substrate in the peripheral region such that the peripheral circuit is between the substrate and the subwavelength-based graded index structure.

7. The optical system of claim 1, wherein:
the subwavelength-based graded index structure comprises a plurality of grating structures made of a first material having a first refractive index and a plurality of trenches filled with a second material having a second refractive index, wherein the first refractive index is higher than the second refractive index.

8. The optical system of claim 7, further comprising:
a plurality of plugs, where each of the plurality of plugs seals an opening of a corresponding trench of the plurality of the trenches.

9. The optical system of claim 7, further comprising:
a plug layer configured to seal openings of the plurality of the trenches.

10. The optical system of claim 7, wherein:
the first material is one selected from silicon and silicon oxide, and
the second material is one selected from air, a vacuum and oxide.

11. The optical system of claim 7, wherein:
the subwavelength-based graded index structure comprises a graded index pattern formed by an alternating arrangement of the plurality of grating structures and the plurality of trenches.

12. The optical system of claim 7, wherein the plurality of trenches, disposed over the peripheral region, encircle the active region.

13. The optical system of claim 1, wherein the local effective refractive index varies along a horizontal direction.

14. An optical system, comprising:
a substrate including an active region and a peripheral region that is peripheral to the active region;
an optical sensor disposed at the active region of the substrate and configured to receive light and output a measurement signal based on the received light; and
at least one subwavelength-based graded index structure provided over the peripheral region of the substrate, wherein the subwavelength-based graded index structure is configured to redirect the light from a region over the peripheral region onto the optical sensor,
wherein the subwavelength-based graded index structure comprises a graded index pattern, formed by a one-by-one alternating arrangement of grating structures and trenches, and that has a varied duty ratio that controls a local effective refractive index of the subwavelength-based graded index structure.

15. The optical system of claim 14, wherein:
the active region is disposed between a first side of the peripheral region and a second side of the peripheral region, and
the varied duty ratio increases from an outer region of the subwavelength-based graded index structure towards an inner region of the subwavelength-based graded index structure such that a width of each successive grating structure of the grating structures at the first side of the peripheral region and at the second side of the peripheral region increases from the outer region towards the inner region of the subwavelength-based graded index structure.

16. The optical system of claim 14, wherein the subwavelength-based graded index structure is excluded from a region over the active region.

17. The optical system of claim 14, wherein the optical system is a photo sensor pixel.

18. An optical system, comprising:
- a substrate including an active region and a peripheral region that is peripheral to the active region;
- an optical sensor disposed at the active region of the substrate and configured to receive light and output a measurement signal based on the received light; and
- at least one subwavelength-based graded index structure provided over the peripheral region of the substrate, wherein the subwavelength-based graded index structure is configured to redirect the light from a region over the peripheral region onto the optical sensor,
- wherein the subwavelength-based graded index structure comprises a graded index pattern, formed by a one-by-one alternating arrangement of grating structures and trenches, and that has a local effective refractive index that varies over the peripheral region.

19. The optical system of claim 17, wherein:
- the active region is disposed between a first side of the peripheral region and a second side of the peripheral region, and wherein the local effective refractive index of the subwavelength-based graded index structure increases from an outer region of the first side of the peripheral region towards an inner region of the first side of the peripheral region, and the local effective refractive index increases from an outer region of the second side of the peripheral region towards an inner region of the second side of the peripheral region.

20. The optical system of claim 17, wherein the subwavelength-based graded index structure is excluded from a region over the active region.

* * * * *